(12) United States Patent
Choi et al.

(10) Patent No.: US 10,784,385 B2
(45) Date of Patent: Sep. 22, 2020

(54) SOLAR CELL AND SOLAR CELL MODULE

(71) Applicant: LG ELECTRONICS INC., Seoul (KR)

(72) Inventors: Chulchae Choi, Seoul (KR); Changseo Park, Seoul (KR); Jinsung Kim, Seoul (KR); Jaewon Chang, Seoul (KR); Hyungseok Kim, Seoul (KR); Youngho Choe, Seoul (KR); Philwon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 236 days.

(21) Appl. No.: 14/341,637

(22) Filed: Jul. 25, 2014

(65) Prior Publication Data

US 2014/0332060 A1    Nov. 13, 2014

Related U.S. Application Data

(63) Continuation of application No. 12/721,353, filed on Mar. 10, 2010, now abandoned.

(30) Foreign Application Priority Data

Mar. 11, 2009    (KR) .................. 10-2009-0020532

(51) Int. Cl.
*H01L 31/0224* (2006.01)
*H01L 31/05* (2014.01)
(Continued)

(52) U.S. Cl.
CPC .... *H01L 31/022441* (2013.01); *H01L 31/049* (2014.12); *H01L 31/0516* (2013.01); *H01L 31/0682* (2013.01); *Y02E 10/547* (2013.01)

(58) Field of Classification Search
CPC .......... H01L 31/022441; H01L 31/048; H01L 31/0516; H01L 31/049; H01L 31/05; H01L 31/0508
See application file for complete search history.

(56) References Cited

U.S. PATENT DOCUMENTS 5,951,786 A     9/1999  Gee et al.
6,395,972 B1 *  5/2002  Tran .................. H01L 31/188
                                                 136/244

(Continued)

FOREIGN PATENT DOCUMENTS

JP    2001-237444 A    8/2001
JP    2005-340362 A    12/2005
(Continued)

*Primary Examiner* — Bethany L Martin
(74) *Attorney, Agent, or Firm* — Birch, Stewart, Kolasch & Birch, LLP

(57) ABSTRACT

A solar cell is disclosed. The solar cell includes a substrate of a first conductive type; a plurality of emitter layers having a second conductive type opposite the first conductive type, the plurality of emitter layers positioned in a first surface of the substrate and extended in a first direction in the first surface of the substrate; a plurality of surface field layers having the first conductive type more heavily doped than the substrate, the plurality of surface field layers positioned in the first surface of the substrate and extended in the first direction in the first surface of the substrate; a passivation layer positioned on the first surface of the substrate and including a plurality of first openings exposing portions of each of the plurality of surface field layers and a plurality of second openings exposing portions of each of the plurality of emitter layers; a plurality of first electrodes positioned in the plurality of first openings and contacting the plurality of surface field layers; a plurality of second electrodes positioned in the plurality of second openings and contacting the plurality of emitter layers; a plurality of first conductive (Continued)

members positioned on the plurality of first electrodes; and a plurality of second conductive members positioned on the plurality of second electrodes.

19 Claims, 6 Drawing Sheets

(51) Int. Cl.
*H01L 31/049* (2014.01)
*H01L 31/068* (2012.01)

(56) References Cited

U.S. PATENT DOCUMENTS

| | | | |
|---|---|---|---|
| 6,399,412 | B1 | 6/2002 | Asai et al. |
| 2001/0020485 | A1* | 9/2001 | Ford ................. H01L 31/03682 136/244 |
| 2001/0035205 | A1 | 11/2001 | Kurata et al. |
| 2006/0231802 | A1 | 10/2006 | Konno |
| 2007/0089780 | A1* | 4/2007 | Geyer ............. H01L 31/035281 136/256 |
| 2007/0169808 | A1 | 7/2007 | Kherani et al. |
| 2007/0199588 | A1 | 8/2007 | Rubin et al. |
| 2007/0227584 | A1* | 10/2007 | Tsunomura ........... H01L 31/048 136/251 |
| 2007/0256733 | A1* | 11/2007 | Karakida ........ H01L 31/022425 136/256 |
| 2008/0236655 | A1* | 10/2008 | Baldwin ............... H01L 31/188 136/251 |
| 2009/0025782 | A1 | 1/2009 | Ojima et al. |
| 2009/0056798 | A1 | 3/2009 | Merchant et al. |
| 2009/0272419 | A1 | 11/2009 | Sakamoto et al. |
| 2010/0059109 | A1* | 3/2010 | Nakayashiki ... H01L 31/022425 136/255 |
| 2010/0084009 | A1* | 4/2010 | Carlson ................. H01L 31/062 136/255 |
| 2010/0139746 | A1 | 6/2010 | Von Maydell et al. |
| 2010/0190286 | A1* | 7/2010 | Kohira .................... H01L 31/18 438/57 |
| 2010/0263718 | A1* | 10/2010 | Abiko ............. H01L 31/022441 136/252 |
| 2011/0000532 | A1* | 1/2011 | Niira .................... H01L 31/0747 136/255 |
| 2011/0120530 | A1 | 5/2011 | Isaka |

FOREIGN PATENT DOCUMENTS

| | | | | |
|---|---|---|---|---|
| WO | WO 2008/115814 A2 | | 9/2008 | |
| WO | WO2008115814 | * | 9/2008 | ........... H01L 31/062 |
| WO | WO 2009/060753 A1 | | 5/2009 | |
| WO | WO2009060753 | * | 5/2009 | ..... H01L 31/022441 |
| WO | WO2009096539 | * | 8/2009 | ......... H01L 31/0747 |

* cited by examiner

SOLAR CELL AND SOLAR CELL MODULE

CROSS-REFERENCE TO RELATED APPLICATIONS

This application is a Continuation of co-pending U.S. patent application Ser. No. 12/721,353 filed on Mar. 10, 2010, which claims priority to Korean Patent Application No 10-2009-0020532 filed on Mar. 11, 2009, the entire contents of all of the above applications are hereby incorporated by reference.

BACKGROUND OF THE INVENTION

Field of the Invention

Embodiments of the invention relate to a solar cell and a solar cell module.

Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A silicon solar cell generally includes a substrate and an emitter layer, each of which is formed of a semiconductor, and a plurality of electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), The electrons and holes are respectively collected by the electrode electrically connected to the emitter layer and the electrode electrically connected to the substrate. The electrodes are connected to one another using electric wires to thereby obtain electric power.

The electrode connected to the emitter layer and the electrode connected to the substrate may be respectively positioned on an incident surface of the substrate on which light is incident and a surface of the substrate, opposite the incident surface, on which light is not incident. Alternatively, the electrode connected to the emitter layer and the electrode connected to the substrate may be positioned on the surface of the substrate opposite the incident surface.

When all of the electrodes connected to the emitter layer and the substrate are positioned on the surface of the substrate opposite the incident surface, an incident area of light increases. Hence, efficiency of the solar cell is improved.

SUMMARY OF THE INVENTION

Embodiments of the invention provide a solar cell capable of improving an operational efficiency and a solar cell module including the solar cell.

In one aspect, there is a solar cell including a substrate of a first conductive type, a plurality of emitter layers of a second conductive type opposite the first conductive type, a plurality of first conductive members partially connected to the substrate, and a plurality of second conductive members partially connected to each of the plurality of emitter layers.

A first conductive member being an outermost one of the plurality of first conductive members and a second conductive member being an outermost one of the plurality of second conductive members may be positioned on the same line.

Each of the plurality of first conductive members and each of the plurality of second conductive members may have a ball shape.

The plurality of emitter layers may be positioned in a surface of the substrate on which light is not incident.

The solar cell may further include a passivation layer positioned on the plurality of emitter layers.

The passivation layer may include a plurality of first openings exposing portions of each of the plurality of emitter layers. The plurality of second conductive members may be positioned in the plurality of first openings and may be connected to the exposed portions of each of the plurality of emitter layers exposed through the plurality of first openings.

The solar cell may further include a plurality of surface field layers that are positioned in the surface of the substrate, on which light is not incident, to be spaced apart from the plurality of emitter layers.

The plurality of emitter layers and the plurality of surface field layers may extend in the same direction in the surface of the substrate on which light is not incident.

Ends of the plurality of emitter layers and ends of the plurality of surface field layers may be positioned on the same line.

The passivation layer may further include a plurality of second openings exposing portions of each of the plurality of surface field layers. The plurality of first conductive members may be positioned in the plurality of second openings and may be connected to the exposed portions of each of the plurality of surface field layers exposed through the plurality of second openings.

The solar cell may further include a plurality of first electrodes, that are positioned in the plurality of first openings and are positioned between each of the plurality of emitter layers and the plurality of second conductive members, and a plurality of second electrodes, that are positioned in the plurality of second openings and are positioned between each of the plurality of surface field layers and the plurality of first conductive members.

A first electrode being an outermost one of the plurality of first electrodes and a second electrode being an outermost one of the plurality of second electrodes may be positioned on the same line.

Each of the plurality of first electrodes and each of the plurality of second electrodes may contain silver (Ag). Each of the plurality of first electrodes and each of the plurality of second electrodes may further contain at least one selected from the group consisting of nickel (Ni), copper (Cu), aluminum (Al), tin (Sn), zinc (Zn), indium (In), titanium (Ti), gold (Au), and a combination thereof.

The plurality of first electrodes and the plurality of second electrodes may be formed using at least one of a deposition method, a printing method, an electroplating method, and an electroless plating method.

Each of the plurality of first openings and each of the plurality of second openings may have a rectangle shape.

The solar cell may further include a surface field layer of the first conductive type positioned in a surface of the substrate on which light is incident.

Each of the plurality of first conductive members and each of the plurality of second conductive members may be formed of SnPb-based material or Pb-free material.

The plurality of first conductive members and the plurality of second conductive members may be formed using a deposition method or an electroplating method.

The solar cell may further include a plurality of first electrodes positioned between the plurality of first conductive members and the substrate and a plurality of second electrodes positioned between the plurality of second conductive members and each of the plurality of emitter layers.

The plurality of first electrodes and the plurality of first conductive members may be positioned in the same direction as the plurality of second electrodes and the plurality of second conductive members.

In another aspect, there is a solar cell module having a plurality of solar cells each including a plurality of surface field layers positioned in a substrate, a plurality of emitter layers positioned in the substrate, a plurality of first conductive members partially connected to each of the plurality of surface field layers, and a plurality of second conductive members partially connected to each of the plurality of emitter layers, first and second protective layers that are positioned on opposite sides of the plurality of solar cells and protect the plurality of solar cells, a transparent member positioned on the first protective layer, and a back sheet underlying the second protective layer, the back sheet having a first electrode pattern part, that contacts the plurality of first conductive members of each of the plurality of solar cells to electrically connect the plurality of first conductive members to one another, and a second electrode pattern part that contacts the plurality of second conductive members of each of the plurality of solar cells to electrically connect the plurality of second conductive members to one another.

The second protective layer may include a plurality of first openings exposing the plurality of first conductive members of the plurality of solar cells and a plurality of second openings exposing the plurality of second conductive members of the plurality of solar cells. The plurality of first conductive members may contact the first electrode pattern part through the plurality of first openings, and the plurality of second conductive members may contact the second electrode pattern part through the plurality of second openings.

The first electrode pattern part and the second electrode pattern part may be positioned adjacent to each other and may be connected to each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1:
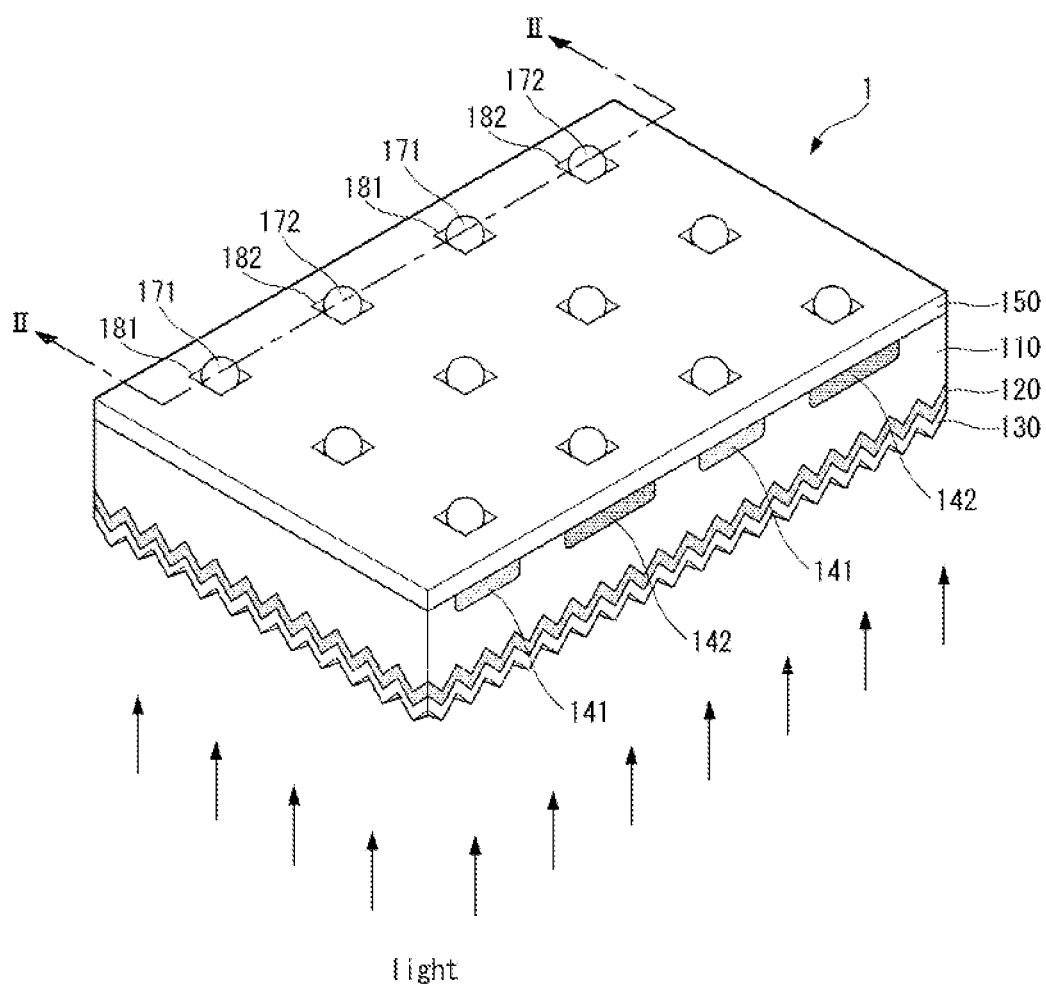
FIG. 1 is a perspective view of a solar cell according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

A solar cell according to an embodiment of the invention is described below in detail with reference to FIGS. 1 to 4.

Figure 2:
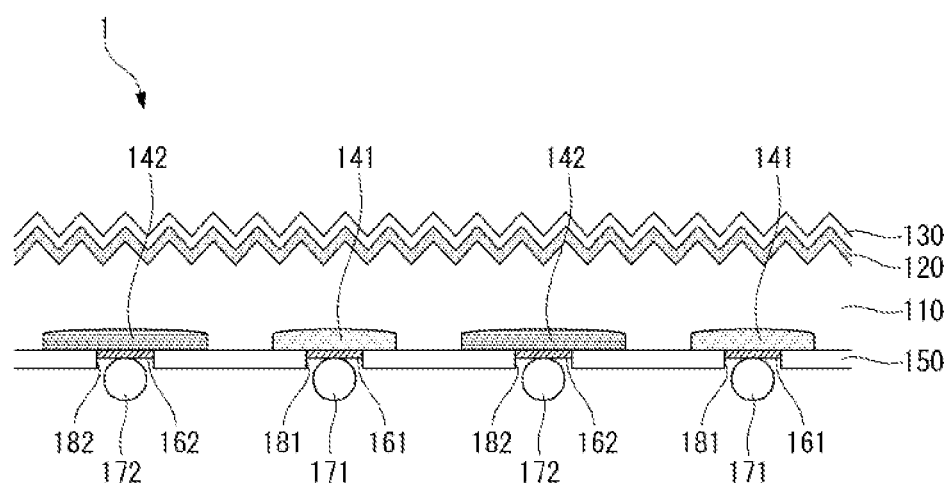
FIG. 2 is a cross-sectional view taken along line II-II of FIG. 1.
Figure 3:
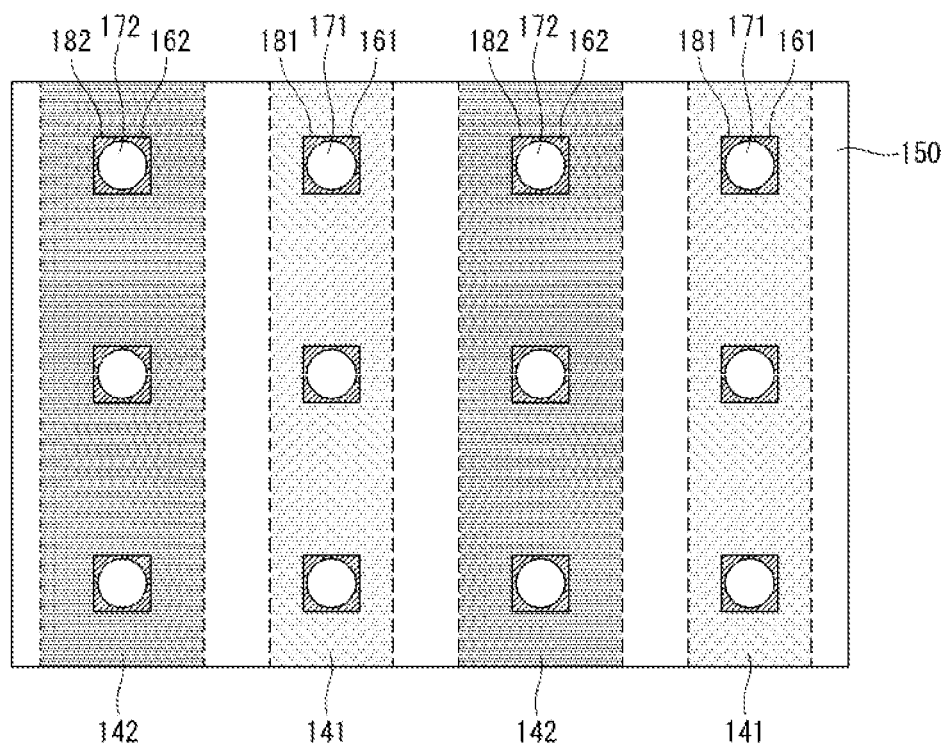
FIG. 3 is a plan view of a back surface of the solar cell shown in FIG. 1.
Figure 4:
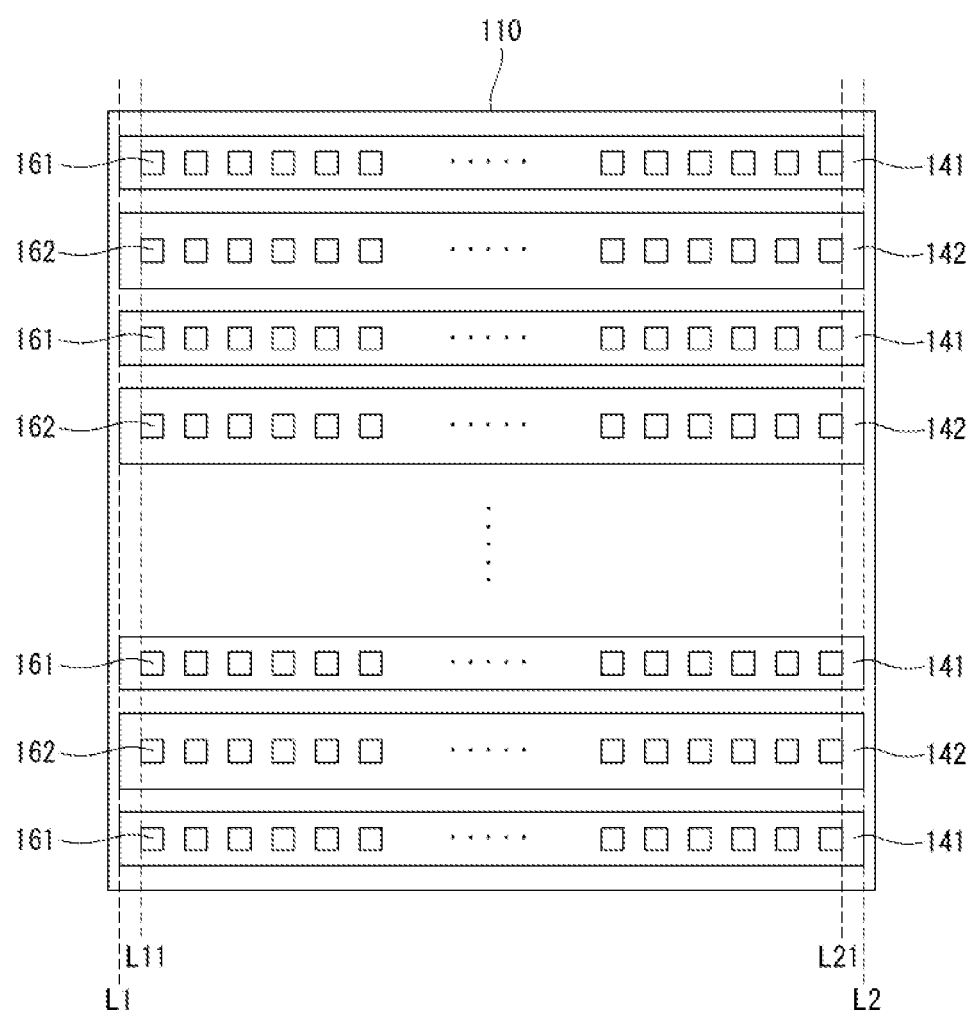
FIG. 4 is a plan view illustrating a plurality of first and second impurity regions in a back surface of a substrate of a solar cell according to an embodiment of the invention, a plurality of first electrodes on the first impurity regions, and a plurality of second electrodes on the second impurity regions.

FIG. 1 is a perspective view of a solar cell according to an embodiment of the invention. FIG. 2 is a cross-sectional view taken along line II-II of FIG. 1. FIG. 3 is a plan view of a back surface of the solar cell shown in FIG. 1. FIG. 4 is a plan view illustrating a plurality of first and second impurity regions in a back surface of a substrate of a solar cell according to an embodiment of the invention, a plurality of first electrodes on the first impurity regions, and a plurality of second electrodes on the second impurity regions.

As shown in FIGS. 1 and 2, a solar cell 1 according to an embodiment of the invention includes a substrate 110, a front surface field layer 120 positioned in a surface (hereinafter, referred to as "a front surface") of the substrate 110 on which light is incident, an anti-reflection layer 130 positioned on the front surface field layer 120, a plurality of first impurity regions 141 positioned in a surface (hereinafter, referred to as "a back surface") of the substrate 110, opposite the front surface of the substrate 110, on which the light is not incident, a plurality of second impurity regions 142 that are positioned in the back surface of the substrate 110 to be spaced apart from the plurality of first impurity regions 141, a back passivation layer 150 positioned on the first impurity regions 141 and the second impurity regions 142, a plurality of first electrodes 161 that are positioned on the plurality of first impurity regions 141 and contact the plurality of first impurity regions 141, a plurality of second electrodes 162 that are positioned on the plurality of second impurity regions 142 and contact the plurality of second impurity regions 142, a plurality of first solder balls 171 connected to the plurality of first electrodes 161, and a plurality of second solder balls 172 connected to the plurality of second electrodes 162.

The substrate 110 is a semiconductor substrate formed of first conductive type silicon, for example, an n-type silicon, though not required. Examples of silicon include crystalline silicon, such as single crystal silicon and polycrystalline silicon, and amorphous silicon. If the substrate 110 is of the n-type, the substrate 110 may contain impurities of a group V element such as phosphorus (P), arsenic (As), and antimony (Sb). Alternatively, the substrate 110 may be of a p-type. If the substrate 110 is of the p-type, the substrate 110 may contain impurities of a group III element such as boron (B), gallium (Ga), and indium (In). Other semiconductor materials may be used for the substrate 110.

The front surface of the substrate 110 is textured to form a textured surface corresponding to an uneven surface. Hence, a light reflectance of the front surface of the substrate 110 is reduced. Further, because a light incident operation and a light reflection operation are many times performed on the textured surface of the substrate 110, the light is confined in the solar cell 1. Hence, a light absorption increases and the efficiency of the solar cell 1 is improved. A plurality of protrusions of the textured surface may have a non-uniform pyramid structure, and a height of each of the protrusions may be approximately 1 μm to 10 μm. Hence, a light reflectance of the textured surface of the substrate 100 may be reduced to about 11%.

The front surface field layer 120 positioned in the front surface of the substrate 110 is formed by more heavily doping the substrate 110 with impurities (e.g., n-type impurities) of the same conductive type as the substrate 110 than the substrate 110. Thus, the impurities of the same conductive type as the substrate 110 may be impurities of a group V element such as P, As, and Sb. Hence, the movement of carriers (e.g., holes) around the surface of the substrate 110 is prevented or reduced by a potential barrier resulting from a difference between impurity concentrations of the substrate 110 and the front surface field layer 120. Thus, a recombination and/or a disappearance of electrons and holes around the front surface of the substrate 110 are prevented or reduced.

The anti-reflection layer 130 on front surface field layer 120 is formed of silicon nitride (SiNx) and/or silicon oxide (SiO$_x$). The anti-reflection layer 130 reduces a reflectance of light incident on the substrate 110 and increases a selectivity of a predetermined wavelength band to thereby increase the efficiency of the solar cell 1. The anti-reflection layer 130 may have a thickness of about 70 nm to 80 nm. The anti-reflection layer 130 has a single-layered structure in the embodiment of the invention, but may also have a multi-layered structure such as a double-layered structure. The anti-reflection layer 130 may be omitted, if desired.

The plurality of first impurity regions 141 and the plurality of second impurity regions 142 are positioned in the back surface of the substrate 110 to be spaced apart from one another.

The plurality of first impurity regions 141 are spaced apart from one another and extend substantially parallel to one another in a fixed direction. Each of the first impurity regions 141 is an impurity region obtained by more heavily doping the substrate 110 with impurities (e.g., n-type impurities) of the same conductive type as the substrate 110 than the substrate 110. Each of the first impurity regions 141 serves as a back surface field layer in the same manner as the front surface field layer 120. Hence, carriers (e.g., holes) moving to the first impurity regions 141 are prevented or reduced from moving to the first electrodes 161 by a potential barrier resulting from a difference between impurity concentrations of the substrate 110 and the first impurity regions 141. Thus, a recombination and/or a disappearance of electrons and holes around the first electrodes 161 are prevented or reduced.

The second impurity regions 142 are separated from the first impurity regions 141 and extend substantially parallel to one another in the same direction as an extension direction of the first impurity regions 141. Hence, the first impurity regions 141 and the second impurity regions 142 are alternately positioned in the back surface of the substrate 110.

Each of the second impurity regions 142 is an impurity region obtained by heavily doping the substrate 110 with impurities (e.g., p-type impurities) of a second conductive type opposite the first conductive type of the substrate 110. Each of the second impurity regions 142 serves as an emitter layer, and thus the substrate 110 and the second impurity regions 142 form a p-n junction. Thus, the second impurity regions 142 contain impurities of a group III element such as B, Ga, and In.

A plurality of electron-hole pairs produced by light incident on the substrate 110 are separated into electrons and holes by a built-in potential difference resulting from the p-n junction between the substrate 110 and the second impurity regions 142 each serving as the emitter layer. Then, the separated electrons move to the n-type semiconductor, and the separated holes move to the p-type semiconductor. Thus, when the substrate 110 is of the n-type and the second impurity regions 142 are of the p-type in the embodiment of the invention, the separated electrons move to the first impurity regions 141 and the separated holes move to the second impurity regions 142.

Because the substrate 110 and each of the second impurity regions 142 form the p-n junction, the second impurity regions 142 may be of the n-type if the substrate 110 is of the p-type unlike the embodiment of the invention described above. In this case, the separated electrons move to the second impurity regions 142 and the separated holes move to the first impurity regions 141.

The back passivation layer 150 on the first impurity regions 141 and the second impurity regions 142 has a plurality of first openings 181 exposing a portion of each of the first impurity regions 141 and a plurality of second openings 182 exposing a portion of each of the second impurity regions 142. Each of the first and second openings 181 and 182 has a rectangle shape. Other shapes may be used. For example, each of the first and second openings 181 and 182 may have various shapes such as a circle and an oval.

The back passivation layer 150 may be formed of silicon nitride (SiNx) and/or silicon oxide (SiO$_x$). The back passivation layer 150 shows a passivation effect capable converting unstable bonds existing around the surface of the substrate 110 into stable bonds to thereby prevent or reduce a recombination and/or a disappearance of carriers moving to the back surface of the substrate 110. Further, the back passivation layer 150 reflects light passing through the substrate 110 inside the solar cell 1, so that light incident on the substrate 110 is not reflected outside the solar cell 1. Hence, an amount of light reflected outside the solar cell 1 is reduced.

The plurality of first electrodes 161 are positioned on the exposed portions of the plurality of first impurity regions 141 exposed through the plurality of first openings 181. The first electrodes 161 are electrically and physically connected to the first impurity regions 141.

The plurality of second electrodes 162 are positioned on the exposed portions of the plurality of second impurity regions 142 exposed through the plurality of second openings 182. The second electrodes 162 are electrically and physically connected to the second impurity regions 142. Thus, because the first electrodes 161 are positioned along the first impurity regions 141 and the second electrodes 162 are positioned along the second impurity regions 142, the first and second electrodes 161 and 162 are positioned in the same direction, i.e., an extension direction of the first and second impurity regions 141 and 142.

The first and second electrodes 161 and 162 may be formed by depositing a conductive metal material and then patterning the deposited conductive metal material or by directly performing an electroplating method or an electroless plating method. A thermal process is performed on the first and second electrodes 161 and 162, that are firstly formed using a deposition method or a plating method, under the hydrogen atmosphere, so that the first and second electrodes 161 and 162 and the first and second impurity regions 141 and 142 form a low resistance ohmic contact. Because each of the firstly formed first and second electrodes 161 and 162 is very thin, it is difficult to bring the first and second solder balls 171 and 172 respectively positioned on the very thin first and second electrodes 161 and 162 into electrical contact with the very thin first and second electrodes 161 and 162. Thus, the electroplating method or the electroless plating method may be performed on the firstly formed first and second electrodes 161 and 162 to thereby increase the thickness of each of the firstly formed first and second electrodes 161 and 162. In this case, the thickness of each of the first and second electrodes 161 and 162 may be approximately 3 μm to 150 μm.

The first and second electrodes 161 and 162 may be formed of silver (Ag) and at least one conductive metal material. Examples of the conductive metal material include at least one selected from the group consisting of nickel (Ni), copper (Cu), aluminum (Al), tin (Sn), zinc (Zn), indium (In), titanium (Ti), gold (Au), and a combination thereof. Other conductive metal materials may be used. For example, an ohmic contact between the silicon substrate 110 and aluminum (Al) may be formed using Al as the at least one conductive metal material.

The first electrodes 161 collect carriers moving to the first impurity regions 141 electrically connected to the first electrodes 161 to transfer the carriers to the first solder balls 171. The second electrodes 162 collect carriers moving to the second impurity regions 142 electrically connected to the second electrodes 162 to transfer the carriers to the second solder balls 172.

In the embodiment of the invention, the plurality of first solder balls 171 are positioned only on the plurality of first electrodes 161, and the plurality of second solder balls 172 are positioned only on the plurality of second electrodes 162. The first and second solder balls 171 and 172 are conductive members formed of a conductive material and may be formed of SnPb-based material. Alternatively, the first and second solder balls 171 and 172 may be formed of a material obtained by reducing an amount of Pb contained in a general solder material or Pb-free material obtained by removing Pb from the general solder material, so as to prevent an environmental pollution resulting from Pb.

In the embodiment of the invention, the first and second solder balls 171 and 172 have a ball shape. Other shapes such as a column shape may be used.

The first and second solder balls 171 and 172 are respectively formed on at least a portion of the first electrode 161 and at least a portion of the second electrode 162 using a deposition method or an electroplating method. Hence, the first and second solder balls 171 and 172 are generally positioned in the first and second openings 181 and 182.

The plurality of first solder balls 171 output carriers (e.g., electrons) transferred through the plurality of first electrodes 161 to the outside, and the plurality of second solder balls 172 output carriers (e.g., holes) transferred through the plurality of second electrodes 162 to the outside.

In the embodiment of the invention, because the first and second impurity regions 141 and 142 may be electrically connected to the first and second solder balls 171 and 172 without the first and second electrodes 161 and 162, the first and second electrodes 161 and 162 may be omitted. In this case, the first solder balls 171 are directly connected to the first impurity regions 141, and the second solder balls 172 are directly connected to the second impurity regions 142. Thus, carriers moving to the first and second impurity regions 141 and 142 are collected by the first and second solder balls 171 and 172 and then are output to the outside.

As shown in FIG. 3, the first and second solder balls 171 and 172 are used to electrically connect the first and second impurity regions 141 and 142 to an external device and to perform a point contact in which the first and second solder balls 171 and 172 are partially connected to the first and second impurity regions 141 and 142 through the first and second electrodes 161 and 162. Hence, a bending of the substrate 110 resulting from the first and second electrodes 161 and 162 and the first and second solder balls 171 and 172 positioned on the back surface of the substrate 110 or a bending of the substrate 110 resulting from a difference between thermal expansion coefficients between the substrate 110 and the elements 161, 162, 171, and 172 are prevented or reduced.

In a solar cell according to a comparative example, a plurality of first electrodes are straightly formed along a plurality of first impurity regions and have a stripe shape, and a plurality of second electrodes are straightly formed along a plurality of second impurity regions and have a stripe shape. In other words, each first electrode is straightly positioned along each first impurity region, and each second electrode is straightly positioned along each second impurity region. Hence, a formation area of each first electrode almost overlaps a formation area of each first impurity region, and a formation area of each second electrode almost overlaps a formation area of each second impurity region.

On the other hand, in the solar cell according to the embodiment of the invention, the first and second electrodes 161 and 162 are positioned only in the first and second openings 181 and 182, and the first and second solder balls 171 and 172 are positioned only in the first and second openings 181 and 182. Hence, each first electrode 161 and each first solder ball 171 overlap only at an exposed portion of the first impurity region 141 exposed through the first openings 181, and each second electrode 162 and each second solder ball 172 overlap only at an exposed portion of the second impurity region 142 exposed through the second openings 182. In other words, the plurality of first electrodes 161 are positioned on each first impurity region 141 to be spaced apart from one another at a constant distance, and the plurality of second electrodes 162 are positioned on each second impurity region 142 to be spaced apart from one another at a constant distance. Further, the plurality of first solder balls 171 are positioned on the plurality of first electrodes 161, and the plurality of second solder balls 172 are positioned on the plurality of second electrodes 162. Hence, formation areas of the first and second electrodes 161 and 162 and formation areas of the first and second solder balls 171 and 172 are greatly reduced, compared with the solar cell according to the comparative example.

Accordingly, because the formation areas of the first and second electrodes 161 and 162 on the back surface of the substrate 110 are greatly reduced, the weight of the first and second electrodes 161 and 162 and the weight of the first and second solder balls 171 and 172 are greatly reduced, or the bending of the substrate 110 resulting from the difference between the thermal expansion coefficients between the substrate 110 and the elements 161, 162, 171, and 172 are greatly reduced, compared with the solar cell according to the comparative example. Further, because the solder balls 171 and 172 are formed instead of a stripe-shaped electrode or a bus bar, a thickness of the solar cell 1 is reduced. As a result, the weight of the solar cell 1 is reduced.

In the embodiment of the invention, the first and second solder balls 171 and 172 in addition to the first and second electrodes 161 and 162 are further formed on the back surface of the substrate 110, compared with the solar cell according to the comparative example. However, because a sum of the weight of the first and second electrodes 161 and 162 and the weight of the first and second solder balls 171 and 172 is much less than the weight of the electrodes in the comparative example, the bending of the substrate 110 is prevented or reduced.

The solar cell according to the comparative example includes a first bus bar, that extends in a direction crossing the stripe-shaped first electrodes to connect the stripe-shaped first electrodes to one another, and a second bus bar that extends in a direction crossing the stripe-shaped second electrodes to connect the stripe-shaped second electrodes to one another. The first and second bus bars are generally positioned at an edge of the substrate and are opposite to each other. The first and second bus bars collect all of carriers moving along each first electrode and each second electrode to output the carriers to the outside.

However, the solar cell 1 according to the embodiment of the invention does not include a first bar for electrically connecting the first solder balls 171 to one another and a second bar for electrically connecting the second solder balls 172 to one another. Hence, as shown in FIG. 4, because the first and second impurity regions 141 and 142 are formed in an area of the substrate 110 (for example, an edge of the substrate 110) for the first and second bus bars, formation areas of the first and second impurity regions 141 and 142 increase. As a result, the efficiency of the solar cell 1 increases.

Furthermore, because the first and second bus bars are not formed, locations of ends of the first and second impurity regions 141 and 142 are substantially the same as each other. More specifically, as shown in FIG. 4, left ends of the first and second impurity regions 141 and 142 are positioned on the same line L1, and right ends of the first and second impurity regions 141 and 142 are positioned on the same line L2. Further, a location of an end of the last first electrode 161 in an extension direction of the first electrodes 161 (for example, the leftmost first electrode or the rightmost first electrode in the extension direction of the first electrodes 161 in FIG. 4) is substantially the same as a location of an end of the last second electrode 162 in an extension direction of the second electrodes 162 (for example, the leftmost second electrode or the rightmost second electrode in the extension direction of the second electrodes 162 in FIG. 4). In this case, left ends of the first and second electrodes 161 and 162 are positioned on the same line L11, and right ends of the first and second electrodes 161 and 162 are positioned on the same line L21. All of the lines L1, L11, L2, L21 shown in FIG. 4 are lines substantially perpendicular to a transverse direction of the substrate 110. The solar cell 1 having the above-described structure is a back contact solar cell in which the second impurity regions 142, the second electrodes 162, and the second solder balls 172 are positioned in the back surface of the substrate 110 on which light is not incident. An operation of the back contact solar cell 1 is described below.

When light irradiated to the solar cell 1 is incident on the substrate 110 through the anti-reflection layer 130 and the front surface field layer 120, a plurality of electron-hole pairs are generated in the substrate 110 by light energy based on the incident light. Further, a reflection loss of light incident on the substrate 110 decreases because of the textured surface of the substrate 110 and the anti-reflection layer 130, and thus an amount of the light incident on the substrate 110 further increases. The electron-hole pairs are separated from one another by the p-n junction between the substrate 110 and the second impurity regions 142, and the separated electrons move to the n-type first impurity regions 141 and the separated holes move to the p-type second impurity regions 142. The electrons moving to the first impurity regions 141 are collected by the first electrodes 161 and then are output to an external device through the first solder balls 171, and the holes moving to the second impurity regions 142 are collected by the second electrodes 162 and then are output to the external device through the second solder balls 172.

In the embodiment of the invention, because the first and second electrodes 161 and 162, which prevent light from being incident on the substrate 110, are positioned on the back surface of the substrate 110, an amount of light incident on the substrate 110 increases. Hence, a series resistance of the solar cell 1 is reduced, and thus the efficiency of the solar cell 1 is improved. Further, an amount of carriers recombined by the front surface field layer 120 and the back passivation layer 150 is reduced, and thus the efficiency of the solar cell 1 is further improved.

Furthermore, because the solar cell 1 according to the embodiment of the invention does not include the bus bars, formation locations of the first and second impurity regions 141 and 142 extend to what would be the formation locations of the bus bars. Further, formation locations of the first solder balls 171 and the first electrodes 161 connected to the first impurity regions 141 and formation locations of the second solder balls 172 and the second electrodes 162 connected to the second impurity regions 142 extend. Thus, a generation amount of carriers increases because of an increase in the formation areas of the first and second impurity regions 141 and 142, and also a collection amount of carriers increases because the formation locations of the first and second solder balls 171 and 172 and the formation locations of the first and second electrodes 161 and 162 extend. As a result, the efficiency of the solar cell 1 is further improved.

Although the above-described solar cell 1 may be individually used, the plurality of solar cells 1 having the same structure may be electrically connected to one another to form a solar cell module for more efficient use of the solar cells 1. As described above, the solar cell 1 does not include the first bar for electrically connecting the first solder balls 171 to one another and the second bar for electrically connecting the second solder balls 172 to one another. Thus, the solar cell module including the plurality of solar cells 1 includes a conductive pattern used to electrically connect the first solder balls 171 of each solar cell 1 to one another and to electrically connect the second solder balls 172 of each solar cell 1 to one another.

A solar cell module according to an embodiment the invention is described below with reference to FIGS. 5 and 6.

Figure 5:
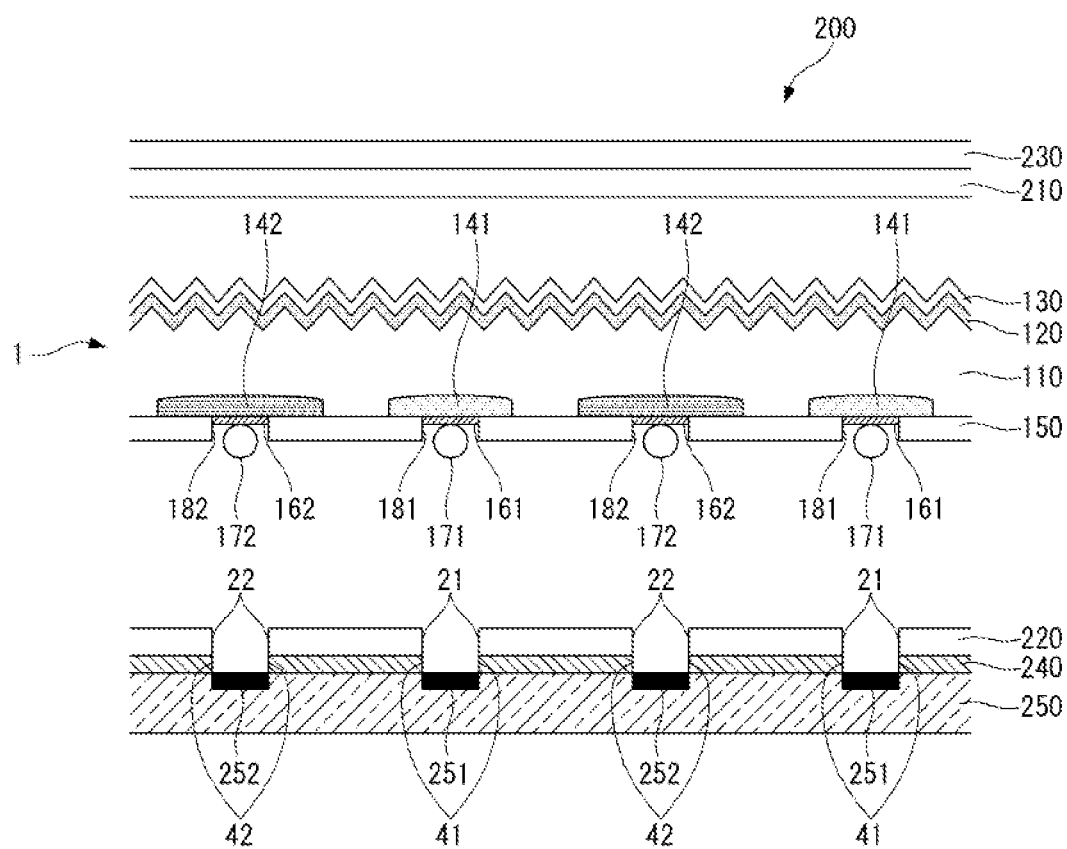
FIG. 5 is a schematic cross-sectional view of a solar cell module according to an embodiment of the invention.
Figure 6:
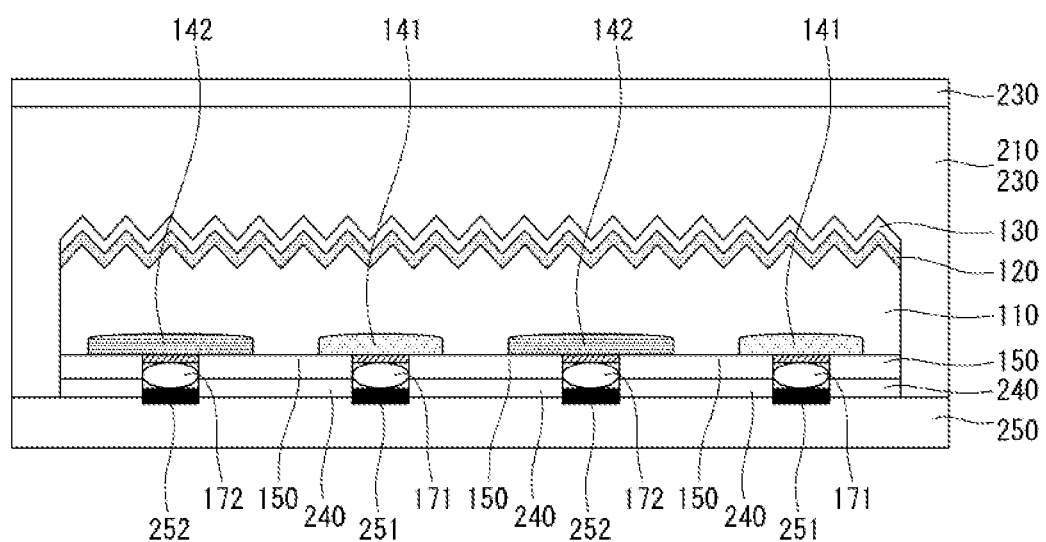
FIG. 6 is a cross-sectional view of the solar cell module including one solar cell obtained after laminating the solar cell module shown in FIG. 5.

FIG. 5 is a schematic cross-sectional view of a solar cell module according to an embodiment of the invention. FIG. 6 is a cross-sectional view of the solar cell module including one solar cell obtained after laminating the solar cell module shown in FIG. 5.

As shown in FIG. 5, a solar cell module 200 according to an embodiment of the invention includes a solar cell 1, protective layers 210 and 220 for protecting the solar cell 1, a transparent member 230 on the protective layer 210 (hereinafter, referred to as "upper protective layer") positioned on a light receiving surface of the solar cell 1, an insulating layer 240 underlying the protective layer 220 (hereinafter, referred to as "lower protective layer") positioned on a surface, opposite the light receiving surface, on which light is not incident, and a back sheet 250 underlying the insulating layer 240.

Although FIG. 5 illustrates only one solar cell 1 of the solar cell module 200, the solar cell module 200 includes the plurality of solar cells 1. The plurality of solar cells 1 are arranged in a matrix structure and are connected in series or in parallel to one another.

The upper and lower protective layers 210 and 220 prevent corrosion of metal resulting from the moisture penetration and protect the solar cell module 200 from an impact. The upper and lower protective layers 210 and 220 and the solar cell 1 form an integral body when a lamination process is performed in a state where the upper and lower protective layers 210 and 220 are respectively positioned on and under the solar cell 1. The upper and lower protective layers 210 and 220 may be formed of ethylene vinyl acetate (EVA), for example. The lower protective layer 220 has a plurality of openings 21 and 22 corresponding to a plurality of first openings 181 and a plurality of second openings 182.

The transparent member 230 on the upper protective layer 210 may be formed of a tempered glass having a high transmittance capable of preventing a damage. The tempered glass may be a low iron tempered glass containing a small amount of iron. The transparent member 230 may have an embossed inner surface so as to increase a scattering effect of light.

The insulating layer 240 on the back sheet 250 has a plurality of openings 41 and 42. The plurality of openings 41 are positioned at locations corresponding to the plurality of openings 21 of the lower protective layer 220, and the plurality of openings 42 are positioned at locations corresponding to the plurality of openings 22 of the lower protective layer 220. The insulating layer 240 electrically insulates between the lower protective layer 220 and the back sheet 250. The insulating layer 240 is omitted, if desired.

Thus, the plurality of openings 41 and 21 substantially overlap the plurality of openings 181, and the plurality of openings 42 and 22 substantially overlap the plurality of openings 182. As a result, the openings 41 and 21 have substantially the same shape as the openings 181, and the openings 42 and 22 have substantially the same shape as the openings 182. On the contrary, each of the openings 41, 21, 42, and 22 may have a stripe shape at locations corresponding to solder balls 171 and 172 positioned along the corresponding impurity regions 141 and 142. In other words, the openings 41, 21, 42, and 22 may be positioned on the lower protective layer 220 and the insulating layer 240 at locations corresponding to the impurity regions 141 and 142.

The back sheet 250 prevents moisture or oxygen from penetrating into a back surface of the solar cell module 200 to protect the solar cells 1 from an external environment. The back sheet 250, as shown in FIG. 5, includes a pattern part 255, i.e., a conductive pattern including a plurality of first electrode patterns 251 and a plurality of second electrode patterns 252.

A shape of each first electrode pattern 251 is determined based on a location shape of each first solder ball 171 of the solar cell 1, and a shape of each second electrode pattern 252 is determined based on a location shape of each second solder ball 172 of the solar cell 1.

As a result, the first solder balls 171 contact the first electrode patterns 251 passing through the openings 21 and 41 and are electrically connected to one another through the first electrode patterns 251. The second solder balls 172 contact the second electrode patterns 252 passing through the openings 22 and 42 and are electrically connected to one another through the second electrode patterns 252. In the process of contact, the first solder balls 171 originally having a ball shape (see FIG. 5) becomes flattened (see FIG. 6) when the first solder balls 171 comes into contact with the first electrode patterns 251, and become an oblate spheroid shape, among others, for example. Similarly, the second solder balls 172 originally having a ball shape (see FIG. 5) becomes flattened (see FIG. 6) when the second solder balls 172 comes into contact with the second electrode patterns 252, and become an oblate spheroid shape, among others, for example.

The adjacent first and second electrode patterns 251 and 252 are connected to each other. In other words, in plurality of solar cells 1 positioned on the same row, the first electrode patterns 251 corresponding to one solar cell 1 is connected to the second electrode patterns 252 corresponding to a solar cell 1 adjacent to the one solar cell 1, and the second electrode patterns 252 corresponding to the one solar cell 1 is connected to the first electrode patterns 251 corresponding to another solar cell 1 adjacent to the one solar cell 1. For example, the first solder balls 171 of a first solar cell 1 of two adjacent solar cells 1 positioned on the same row are electrically connected to the second solder balls 172 of a second solar cell 1 of the two adjacent solar cells 1. Further, the second solder balls 172 of the first solar cell 1 are electrically connected to the first solder balls 171 of a third solar cell 1 positioned prior to the first solar cell 1, and the first solder balls 171 of the second solar cell 1 are electrically connected to the second solder balls 172 of a fourth solar cell 1 following the second solar cell 1. As a result, the solar cells 1 arranged in the matrix structure are electrically connected in series to one another.

The pattern part 255 of the back sheet 250 may be formed in a desired form by attaching a metal thin plate such as copper (Cu) to the back sheet 250 and then patterning the metal thin plate depending on formation locations of the first and second solder balls 171 and 172.

In the solar cell module 200, carriers transferred by the first and second solder balls 171 and 172 of each solar cell 1 are collected by the pattern part 255, and also the plurality of solar cells 1 arranged in the matrix structure are connected in series or in parallel to one another through the pattern part 255. Hence, carriers collected by the plurality of solar cells 1 are finally output to an external device.

Although FIG. 5 illustrates the pattern part 255 positioned inside the back sheet 250, the pattern part 255 may be positioned on the back sheet 250.

The back sheet 50 may have a multi-layered structure including a moisture/oxygen penetrating prevention layer, a chemical corrosion prevention layer, an insulation layer, etc.

A method for manufacturing the solar cell module 200 may sequentially include testing the plurality of solar cells 1, arranging the tested solar cells 1 in the matrix structure, disposing the elements 210, 220, 230, 240, 250, and 1 in fixed order, more particularly successively disposing the back sheet 250 including the pattern part 255, the insulating layer 240, the lower protective layer 220, the plurality of solar cells 1, the upper protective layer 210, and the transparent member 230 from the bottom of the solar cell module 200 in the order named, performing a lamination process in a vacuum state to form an integral body of the elements 210, 220, 230, 240, 250, and 1 (refer to FIG. 6), performing an edge trimming process to remove an unnecessary portion, testing the solar cell module 200, and the like.

When a misalignment between the plurality of solar cells 1 and the back sheet 250 occurs, a bad contact between the solder balls 171 and 172 and the pattern part 255 is prevented because of the insulating layer 240.

As above, because the pattern part 255 directly contacting the solder balls 171 and 172 is formed in the back sheet 250, a distance ranging from the impurity regions 141 and 142 to the pattern part 255 of the back sheet 250 is greatly reduced to several hundreds of micrometers (μm). Hence, the efficiency of the solar cell module 200 is improved because of a reduction in a wiring resistance.

Although the explanation was given of an example of the solar cell, in which both the first and second electrodes 161 and 162 are positioned on the back surface of the substrate 110, in the embodiments of the invention, the embodiments of the invention may be applied to various solar cells. For example, the embodiments of the invention may be applied to a solar cell in which the plurality of first electrodes 161 are positioned on the front surface of the substrate 110 and the plurality of second electrodes 162 are positioned on the back surface of the substrate 110.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module, comprising:
a plurality of solar cells, each solar cell comprising:
a substrate of a first conductive type;
a plurality of emitter layers having a second conductive type opposite the first conductive type, the plurality of emitter layers positioned in a back surface of the substrate and extended in a first direction in the back surface of the substrate;
a plurality of back surface field layers having the first conductive type more heavily doped than the substrate, the plurality of back surface field layers positioned in the back surface of the substrate and extended in the first direction in the back surface of the substrate;
a passivation layer contacting to the back surface of the substrate and including a plurality of first openings exposing portions of each of the plurality of back surface field layers and a plurality of second openings exposing portions of each of the plurality of emitter layers;
a plurality of first electrodes positioned in the plurality of first openings and contacting the plurality of back surface field layers, and forming a point contact with the plurality of back surface field layers;
a plurality of second electrodes positioned in the plurality of second openings and contacting the plurality of emitter layers, and forming a point contact with the plurality of emitter layers;
a plurality of first conductive members positioned on the plurality of first electrodes; and
a plurality of second conductive members positioned on the plurality of second electrodes;
a first protective layer positioned on a front surface of the plurality of solar cells;
a second protective layer positioned on a back surface of the plurality of solar cells;
a transparent member positioned on the first protective layer; and
a back sheet underlying the second protective layer and positioned at an outermost back side of the solar cell module,
wherein the plurality of first electrodes are arranged to be spaced apart from one another in the first direction on at least one of the plurality of back surface field layers,
wherein the plurality of second electrodes are arranged to be spaced apart from one another in the first direction on at least one of the plurality of emitter layers,
wherein the plurality of first conductive members are arranged to be spaced apart from one another in the first direction on at least one of the plurality of back surface field layers and on at least one of the plurality of first electrodes,
wherein the plurality of second conductive members are arranged to be spaced apart from one another in the first direction on at least one of the plurality of emitter layers and on at least one of the plurality of second electrodes,
wherein each of the plurality of first electrodes and each of the plurality of second electrodes contain at least one selected from the group consisting of silver (Ag), nickel (Ni), copper (Cu), aluminum (Al), tin (Sn), zinc (Zn), indium (In), titanium (Ti), gold (Au), and a combination thereof,
wherein each of the plurality of first conductive members and each of the plurality of second conductive members are formed of Sn based material,
wherein each first electrode is positioned only in a space formed by each of the plurality of first openings of the passivation layer and each second electrode is positioned only in a space formed by each of the plurality of second openings of the passivation layer,
wherein a thickness of each first electrode and a thickness of each second electrode are less than a thickness of the passivation layer,
wherein each of the plurality of first conductive members is inserted and positioned in each of the plurality of first openings, respectively, and each of the plurality of second conductive members is inserted and positioned in each of the plurality of second openings, respectively,
wherein each of the plurality of first conductive members and each of the plurality of second conductive members have an oblate spheroid shape, wherein the back sheet positioned at the outermost back side of the solar cell module includes a first electrode pattern part and a second electrode pattern part, wherein the first electrode pattern part contacts the plurality of first conductive members of each of the plurality of solar cells to electrically connect the plurality of first conductive members to one another, and the second electrode pattern part contacts the plurality of second conductive members of each of the plurality of solar cells to electrically connect the plurality of second conductive members to one another, and wherein back and side surfaces of each of the first and second electrode pattern parts are inserted into the back sheet.

2. The solar cell module of claim 1, wherein a first conductive member being an outermost one of the plurality of first conductive members and a second conductive member being an outermost one of the plurality of second conductive members are positioned on the same line in a second direction crossing the first direction.

3. The solar cell module of claim 1, wherein the back surface of the substrate is a surface of the substrate on which light is not incident.

4. The solar cell module of claim 1, wherein the plurality of second conductive members are positioned in the plurality of second openings and are connected to the exposed portions of each of the plurality of emitter layers exposed through the plurality of second openings.

5. The solar cell module of claim 1, wherein the plurality of back surface field layers are spaced apart from the plurality of emitter layers.

6. The solar cell module of claim 5, wherein the plurality of first conductive members are positioned in the plurality of first openings and are connected to the exposed portions of each of the plurality of back surface field layers exposed through the plurality of first openings.

7. The solar cell module of claim 5, wherein the plurality of second electrodes are positioned between each of the plurality of emitter layers and the plurality of second conductive members, and wherein the plurality of first electrodes are positioned between each of the plurality of back surface field layers and the plurality of first conductive members.

8. The solar cell module of claim 7, wherein the plurality of first electrodes and the plurality of second electrodes are formed using at least one of a deposition method, a printing method, an electroplating method, and an electroless plating method.

9. The solar cell module of claim 6, wherein each of the plurality of first openings and each of the plurality of second openings have a rectangle shape.

10. The solar cell module of claim 1, further comprising a front surface field layer of the first conductive type positioned in a surface of the substrate on which light is incident.

11. The solar cell module of claim 1, wherein the plurality of first electrodes are positioned between the plurality of first conductive members and the substrate and the plurality of second electrodes are positioned between the plurality of second conductive members and each of the plurality of emitter layers.

12. The solar cell module of claim 11, wherein the plurality of first electrodes and the plurality of first conductive members are positioned in the same direction as the plurality of second electrodes and the plurality of second conductive members.

13. The solar cell module of claim 1, wherein an end of the plurality of first electrodes and an end of the plurality of first electrodes are positioned on the same line.

14. The solar cell module of claim 1, wherein the second protective layer comprises a plurality of third openings exposing the plurality of first conductive members of the plurality of solar cells and a plurality of fourth openings exposing the plurality of second conductive members of the plurality of solar cells, and the plurality of first conductive members contact the first electrode pattern part through the plurality of third openings, and the plurality of second conductive members contact the second electrode pattern part through the plurality of fourth openings.

15. The solar cell module of claim 1, wherein the first electrode pattern part and the second electrode pattern part are positioned adjacent to each other and are connected to each other.

16. The solar cell module of claim 1, wherein the plurality of first electrodes are formed to be positioned only within the plurality of first openings, and the plurality of second electrodes are formed to be positioned only within the plurality of second openings.

17. The solar cell module of claim 1, wherein the passivation layer directly contacts the substrate, and wherein the thickness of the plurality of first electrodes disposed within the plurality of first openings and the thickness of the plurality of second electrodes disposed within the plurality of second openings are less than a thickness of a portion of the passivation layer directly contacting the substrate.

18. The solar cell module of claim 14, wherein the plurality of third openings have the same shape as the plurality of first openings, and the plurality of fourth openings have the same shape as the plurality of second openings.

19. The solar cell module of claim 1, wherein the plurality of first conductive members are compressed between the plurality of first electrodes and the first electrode pattern part, and the plurality of second conductive members are compressed between the plurality of second electrodes and the second electrode pattern part.

* * * * *